United States Patent
Wang et al.

(10) Patent No.: US 11,533,028 B2
(45) Date of Patent: Dec. 20, 2022

(54) RADIO FREQUENCY POWER AMPLIFIER WITH HARMONIC CONTROL CIRCUIT AS WELL AS METHOD FOR MANUFACTURING THE SAME

(71) Applicant: Telefonaktiebolaget LM Ericsson (publ), Stockholm (SE)

(72) Inventors: Zhancang Wang, Beijing (CN); Chen He, Beijing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 264 days.

(21) Appl. No.: 17/046,930

(22) PCT Filed: Apr. 17, 2018

(86) PCT No.: PCT/CN2018/083383
§ 371 (c)(1),
(2) Date: Oct. 12, 2020

(87) PCT Pub. No.: WO2019/200532
PCT Pub. Date: Oct. 24, 2019

(65) Prior Publication Data
US 2021/0152140 A1    May 20, 2021

(51) Int. Cl.
*H03F 3/24* (2006.01)
*H01P 3/08* (2006.01)
(Continued)

(52) U.S. Cl.
CPC ............. *H03F 3/245* (2013.01); *H01P 3/081* (2013.01); *H03F 1/0288* (2013.01); *H03F 1/56* (2013.01);
(Continued)

(58) Field of Classification Search
CPC ......... H03F 3/245; H03F 1/0288; H01P 3/081
See application file for complete search history.

(56) References Cited

U.S. PATENT DOCUMENTS 10,122,336 B1 * 11/2018 Jang .................... H03F 1/56
2006/0152300 A1   7/2006 Inoue et al.
(Continued)

FOREIGN PATENT DOCUMENTS

CN    205320036 U    6/2016
JP    2017085395 A   5/2017
(Continued)

OTHER PUBLICATIONS

EPO Communication and Search Report dated Oct. 26, 2021 for Patent Application No. 18915222.6, consisting of 7-pages.
(Continued)

*Primary Examiner* — Patricia T Nguyen
(74) *Attorney, Agent, or Firm* — Christopher & Weisberg, P.A.

(57) ABSTRACT

A radio frequency power amplifier with harmonic control circuit as well as method for manufacturing the same are disclosed. According to an embodiment, a radio frequency power amplifier includes: a planar dielectric substrate, a first conductive layer and a second conducting layer. The first conductive layer is disposed on a first side of the planar dielectric substrate. The second conducting layer is disposed on a second side of the planar dielectric substrate. The first conductive layer has a pattern comprising one or more harmonic control circuits. The second conductive layer acts (Continued)

as a ground plane. The second side of the planar dielectric substrate is opposite to the first side of the planar dielectric substrate.

16 Claims, 13 Drawing Sheets

(51) Int. Cl.
*H03F 1/02* (2006.01)
*H03F 1/56* (2006.01)

(52) U.S. Cl.
CPC .. *H03F 2200/222* (2013.01); *H03F 2200/451* (2013.01)

(56) References Cited

U.S. PATENT DOCUMENTS

| | | | | |
|---|---|---|---|---|
| 2012/0071109 | A1* | 3/2012 | Akesson | H01P 1/20381 455/75 |
| 2015/0008983 | A1* | 1/2015 | Maniwa | H03F 3/19 330/295 |
| 2019/0173431 | A1* | 6/2019 | Srinidhi Embar | H03F 1/486 |
| 2019/0319587 | A1* | 10/2019 | Srinidhi Embar | H05K 1/181 |
| 2020/0373892 | A1* | 11/2020 | Kim | H03F 3/2171 |

FOREIGN PATENT DOCUMENTS

| | | |
|---|---|---|
| WO | 2010134858 A1 | 11/2010 |
| WO | 2016203644 A1 | 12/2016 |

OTHER PUBLICATIONS

Hung-Wei Hsu et al.; Miniaturized Dual-band Ring Bandpass Filter with Harmonic Suppression and Passband Tunability; Proceedings of the Asia-Pacific Microwave Conference 2011; IEEE; Dec. 5, 2011, consisting of 4-pages.

Hiromitsu Uchida et al.; An X-Band Internally-Matched GaN HEMT Amplifier with Compact Quasi-Lumped-Element Harmonic-Terminating Network; Microwave Symposium Digest (MTT); IEEE; Jun. 17, 2012, consisting of 4-pages.

Shichang Chen et al.; Highly Efficient Dual-band Power Amplifier Based on Cascaded CMRCs; Proceedings of the Asia-Pacific Microwave Conference 2012; IEEE; Dec. 4, 2012, consisting of 3-pages.

International Search Report dated Jan. 16, 2019 for International Application No. PCT/CN2018/083383 filed on Apr. 17, 2018, consisting of 6-pages.

* cited by examiner

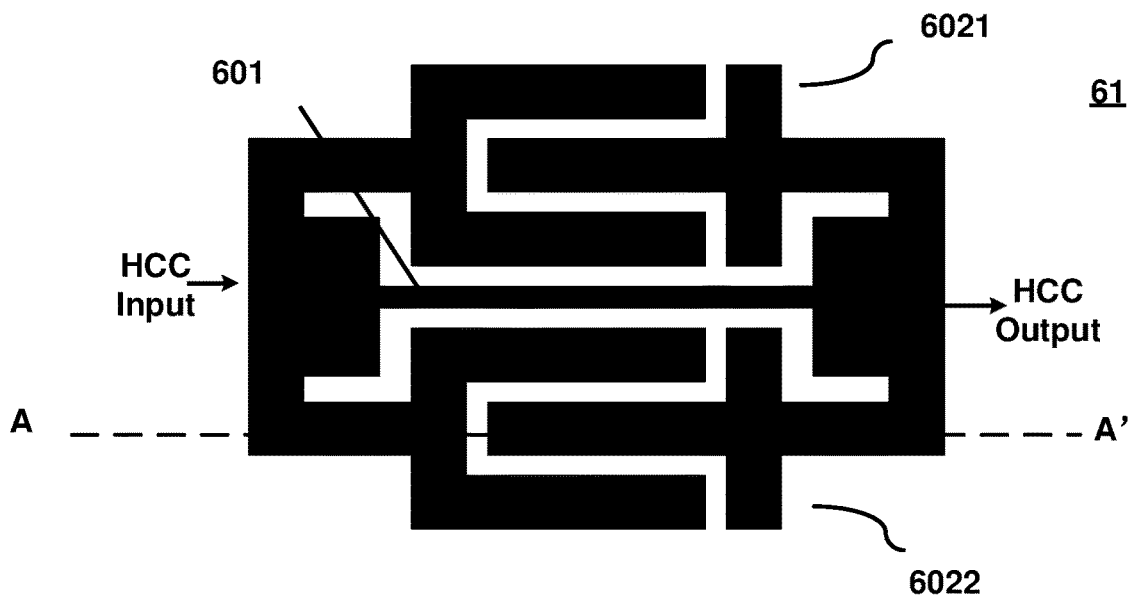
FIG. 5
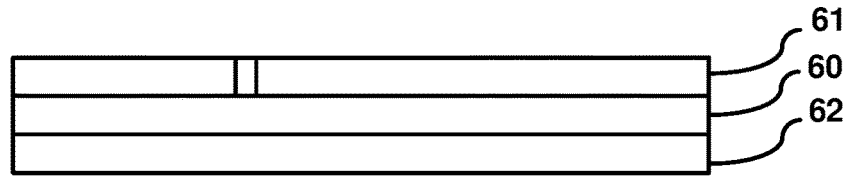
FIG. 6A
FIG. 6B

RADIO FREQUENCY POWER AMPLIFIER WITH HARMONIC CONTROL CIRCUIT AS WELL AS METHOD FOR MANUFACTURING THE SAME

CROSS-REFERENCE TO RELATED APPLICATIONS

This application is a Submission Under 35 U.S.C. § 371 for U.S. National Stage Patent Application of International Application Number: PCT/CN2018/083383, filed Apr. 17, 2018 entitled "RADIO FREQUENCY POWER AMPLIFIER WITH HARMONIC CONTROL CIRCUIT AS WELL AS METHOD FOR MANUFACTURING THE SAME," the entirety of which is incorporated herein by reference.

TECHNICAL FIELD

Embodiments of the disclosure generally relate to the field of electronic components, and, more particularly, to a radio frequency power amplifier with harmonic control circuit as well as a method for manufacturing the same.

BACKGROUND

This section introduces aspects that may facilitate better understanding of the present disclosure. Accordingly, the statements of this section are to be read in this light and are not to be understood as admissions about what is in the prior art or what is not in the prior art.

Currently, among various candidates, Doherty power amplifiers (PAs) are mainstream solutions for radio transmitters of infrastructure base stations. Traditional Doherty PA structures use linear amplifier cells such as class-AB/-B and class-C biased carrier and peaking amplifiers. With the development of modern digital pre-distortion (DPD) schemes, it is possible to use nonlinear amplifier cells (e.g., classes -E, -F, and -$F^{-1}$ mode amplifiers) for Doherty PAs to trade off efficiency to linearity.

For both linear and nonlinear amplifiers in Doherty PAs, amplifier cells with harmonic control could be employed as a direct method to increase the overall efficiency. FIG. 1 shows the influence of harmonic control on the efficiencies of Doherty PAs in an ideal case with different carrier and peaking amplifier technologies. The dashed curves in FIG. 1 correspond to Doherty PAs without harmonic control, while the solid curves correspond to Doherty PAs with harmonic control. It can be seen that the harmonic control can significantly increase the efficiencies of Doherty PAs in the ideal case. In particular, a harmonically controlled Doherty PA with nonlinear amplifier cells can obtain 100% ideal efficiency at the breakpoint (corresponding to 6 dB back-off) and peak power point (corresponding to 0 dB back-off), respectively.

Harmonic control circuits (HCCs) can, for example, be implemented on a separate printed circuit board (PCB) provided outside an active device package or an active device bare-die. Another way of HCC implementation is on-chip, either by using bond wires to connect capacitors or integrated passive devices (IPDs), or by monolithically integrating the passive devices on monolithic microwave integrated circuits (MMICs). The passive devices can be either on the same semiconductor substrate as the active device or on a separate substrate.

In next generation radio frequency (RF) power amplifier (PA) designs, broadband or multiband RF PAs have been developed by using, for example, Gallium Nitride (GaN) high electron mobility transistor (HEMT) technology. For the usage with such PAs, a desired harmonic control circuit (HCC) may have features, such as independence of fundamental components of RF signal, easy physical implementation, insensitivity for matching network of the power amplifier, etc.

In a first existing solution, there is disclosed an HCC 221 as shown in FIG. 2. The HCC 221 comprises a complementary open-loop resonator (e.g., complementary split ring resonator simply referred to as CSSR) 224 that is integrated in a conducting pattern 222, to produce a shunt resonator configured to act as a short-circuit termination on at least one tuned frequency. The conducting pattern 222 is provided in a first conducting layer. The first conducting layer is disposed on a first side of a planar dielectric substrate 223 and faces a second conducting layer on the opposite side of the planar dielectric substrate 223. The second conducting layer acts as a ground plane. The conducting pattern 222 with the integrated complementary open-loop resonator 224 may be part of a matching network of a radio frequency (RF) device.

For the existing HCC design of the first existing solution, the HCC is embedded into conducting pattern with a large space for layout.

In a second existing solution, there is disclosed an RF power amplifier comprising an on-chip transistor 26 and an on-chip harmonic termination circuit formed on a semiconductor substrate. As shown in FIG. 3, a bias circuit 24 is adapted as the harmonic termination circuit to produce an effective low impedance at the signal harmonic frequencies while having the capability of supplying direct current (DC) power to the amplifier stage. The bias circuit 24 takes the form of a pi network including a by-pass capacitor 32, a small capacitor 34 and an RF choke 30. The pi network is coupled to an output of the active device 26 through a predetermined length of transmission line 36 tuned for optimum power added efficiency within the frequency band of operation.

For the existing HCC design of the second existing solution, the bias line is quite sensitive to be implemented for HCC. The HCC may suffer from variations and may impact fundamental components of the signal during matching. The harmonic termination is not independent; thus, the fundamental matching could not be independent from the harmonic tuning process. This may complex the design process. The arrangement positions of the HCC are quite limited and not flexible.

In a third existing solution, there is disclosed a harmonic control circuit as show in FIG. 4. A transmission line of a predetermined physical length being terminated with either a short-circuit or with an open-circuit in one end, provides an alternating short-circuit termination or an open-circuit termination in the other end with a periodicity of twice the frequency at which the electrical length of the transmission line corresponds to a quarter of a wavelength. It is also known that if such a terminated transmission line is connected in shunt to a mainline, a so-called quarter-wave stub is realized, providing an alternating short-circuit to the mainline junction point or being invisible to the main-line with the same periodicity. In FIG. 4, 2O means "2nd harmonic open", 2S means "2nd harmonic short", 3O means "3rd harmonic open", and 3S means "3rd harmonic short". Furthermore, if the junction point of such a quarter-wave stub is offset an arbitrary electrical length from a first mainline terminal, any reflection angle between an open-circuit (i.e. reflection angle 0°) and a short-circuit (i.e. reflection angle) 180° can be obtained. Consequently, by shunting a mainline with one or more stubs of equal or of different lengths at predetermined offset positions relative a first mainline terminal, a single harmonic or a multiple order HCC is achieved.

For the existing HCC design of the third existing solution, the quarter wave length of "shunt" structure of the 2nd and 3rd harmonic takes up more space and makes the HCC not sufficiently compact.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved radio frequency device with harmonic control circuit.

According to one aspect of the disclosure, there is provided a radio frequency power amplifier. The radio frequency power amplifier comprises a planar dielectric substrate, a first conductive layer disposed on a first side of the planar dielectric substrate, and a second conducting layer disposed on a second side of the planar dielectric substrate. The first conductive layer has a pattern comprising one or more harmonic control circuits. The second conductive layer acts as a ground plane. The second side of the planar dielectric substrate is opposite to the first side of the planar dielectric substrate.

In an embodiment of the disclosure, the harmonic control circuit comprises a transmission line of microstrip type; and a first capacitor structure and a second capacitor structure, coupled in parallel with the transmission line, and disposed in symmetry about the transmission line. A width of an end of the transmission line is larger than a width of a main body of the transmission line, to form a step impedance transformer.

In an embodiment of the disclosure, the first capacitor structure and the second capacitor structure comprise a microstrip interdigital capacitor, for increasing a harmonic suppression level at a specific harmonic frequency band.

In an embodiment of the disclosure, the interdigital capacitor comprises at least one U-shaped microstrip coupled in parallel; and at least one T-shaped microstrip coupled in parallel. A U-shaped microstrip comprises two fingers extending in parallel. A T-shaped microstrip comprises a finger, disposed in a space between the two fingers of the U-shaped microstrip, and extending in parallel to the two fingers of the U-shaped microstrip.

In an embodiment of the disclosure, the two fingers of the U-shaped microstrip and the finger of the T-shaped microstrip have a width lager than the width of the main body of the transmission line.

In an embodiment of the disclosure, the harmonic control circuit further comprises an input impendence line of microstrip type, coupled to the transmission line in series, at an input side of the harmonic control circuit; and an output impendence line of microstrip type, coupled to the transmission line in series, at an output side of the harmonic control circuit.

In an embodiment of the disclosure, the transmission line, the first capacitor structure and the second capacitor structure are coupled with each other by a cross junction. The first capacitor structure and the second capacitor structure are coupled to the cross junction through one of: a square corner, and an optimal miter corner.

In an embodiment of the disclosure, the one or more harmonic control circuits are configured independent of both a fundamental frequency matching and a bias network of the radio frequency power amplifier.

In an embodiment of the disclosure, the one or more harmonic control circuits are configured to act as a short-circuit termination or an open-circuit termination over a broadband of harmonic frequencies with deep harmonic suppression levels.

In an embodiment of the disclosure, the planar dielectric substrate is part of: a printed circuit board (PCB) or a semiconductor chip.

In an embodiment of the disclosure, the one or more harmonic control circuits comprises: a plurality of harmonic control circuits cascaded in at least one of: a matching network and a biasing network, to form a high order harmonic control circuit which supports a broader harmonic suppression bandwidth and a deeper harmonic suppression level.

In an embodiment of the disclosure, the radio frequency power amplifier further comprises: an active device comprising one or more input terminals and one or more output terminals; an input matching network arranged between the active device and an input node; an input bias network arranged at the input terminal; an output matching network arranged between the active device and an output node; and an output bias network arranged at the output terminal.

In an embodiment of the disclosure, the one or more harmonic control circuits are inserted into at least one of: a point in the input matching network; a point in the input bias network; a point in the output matching network; a point in the output bias network; a point out of the input matching network and the output matching network; and a point out of the input matching network and the output matching network, while being coupled to the input matching network and/or the output matching network.

In an embodiment of the disclosure, the radio frequency power amplifier is a Doherty amplifier.

In an embodiment of the disclosure, the Doherty amplifier comprises: Gallium Nitride (GaN) high electron mobility transistor (HEMT).

In an embodiment of the disclosure, the harmonic control circuit is configured to act as a short-circuit termination or an open-circuit termination on at least one desired harmonic frequency.

According to another aspect of the disclosure, there is provided a method for manufacturing a radio frequency power amplifier. The method comprises: forming a planar dielectric substrate; forming a first conductive layer disposed on a first side of the planar dielectric substrate, and forming a second conducting layer disposed on a second side of the planar dielectric substrate. The first conductive layer has a pattern comprising one or more harmonic control circuits. The second conductive layer acts as a ground plane. The second side of the planar dielectric substrate is opposite to the first side of the planar dielectric substrate.

In an embodiment of the disclosure, the harmonic control circuit comprises: a transmission line of microstrip type; and a first capacitor structure and a second capacitor structure, coupled in parallel with the transmission line, and disposed in symmetry about the transmission line. A width of an end of the transmission line is larger than a width of a main body of the transmission line, so as to form a step impedance transformer.

These and other objects, features and advantages of the disclosure will become apparent from the following detailed description of illustrative embodiments thereof, which are to be read in connection with the accompanying drawings.

BRIEF DESCRIPTION OF THE DRAWINGS

FIG. 5 is a block diagram showing a radio frequency power amplifier according to an embodiment of the disclosure;

FIGS. 6A-6B are structural views showing a harmonic control circuit according to an embodiment of the disclosure;

DETAILED DESCRIPTION

Figure 1:
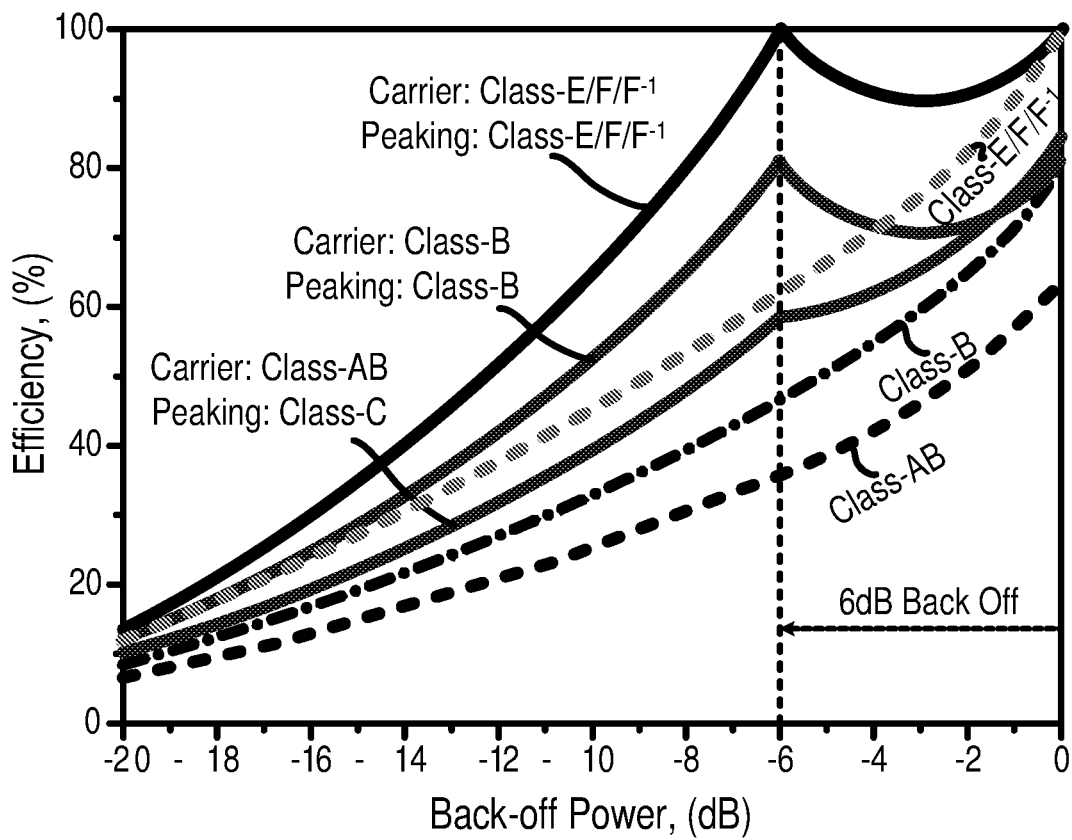
FIG. 1 shows the ideal efficiencies of Doherty PAs with different amplifier technologies.
Figure 2:
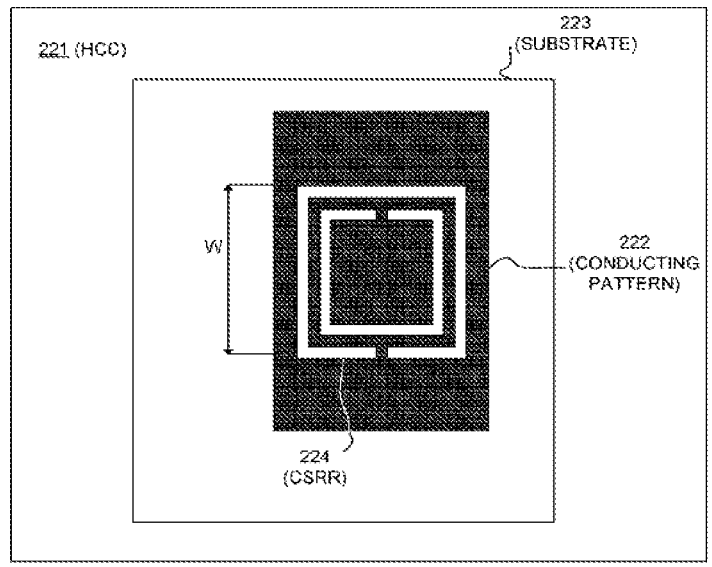
FIG. 2 is a diagram showing a harmonic control circuit of the first existing solution.
Figure 3:
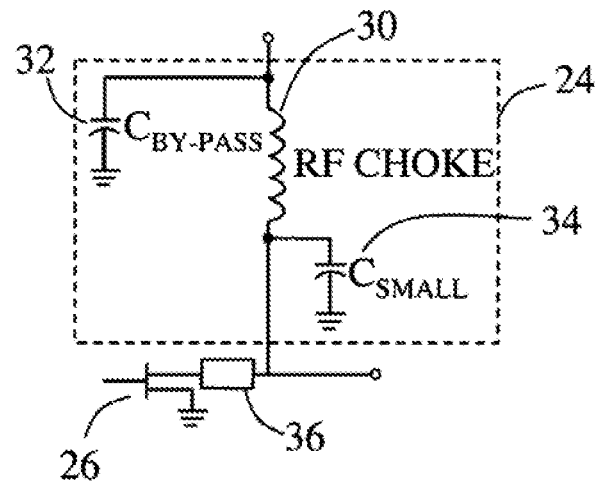
FIG. 3 is a diagram showing a harmonic control circuit of the second existing solution.
Figure 4:
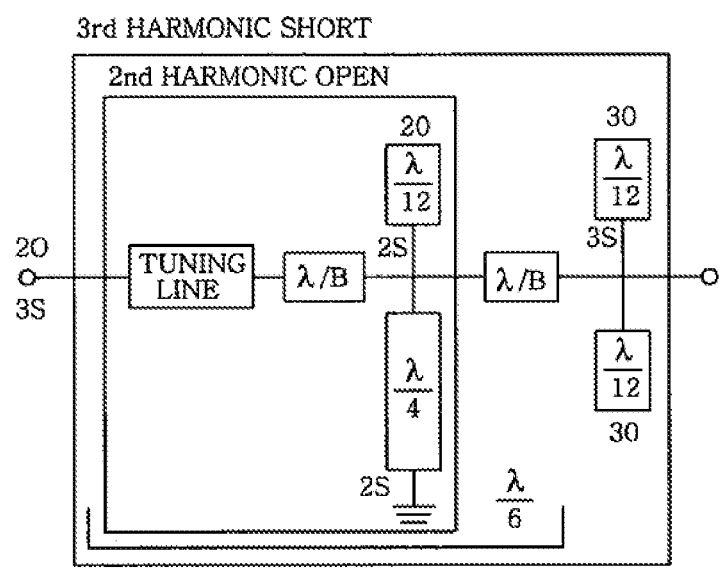
FIG. 4 is a diagram showing a harmonic control circuit of the third existing solution.

For explanation, details are set forth in the following description in order to provide a thorough understanding of the embodiments disclosed. It is apparent, however, to those skilled in the art that the embodiments may be implemented without these specific details or with an equivalent arrangement.

The present disclosure proposes a radio frequency power amplifier with improved HCC solution. Hereinafter, the solution will be described in detail with reference to FIGS. 5-18.

FIG. 5 is a block diagram showing a radio frequency power amplifier according to an embodiment of the disclosure. As shown, the radio frequency power amplifier (RF PA) 5 includes a harmonic control circuit (HCC) 51. As an example, the RF PA 5 may be a Doherty amplifier. The Doherty amplifier may comprise Gallium Nitride (GaN) high electron mobility transistor (HEMT). The RF PA 5 may be used in a radio unit (e.g., remote radio unit, simply referred to as RRU) of a base station. As another example, the RF PA 5 may be used in a radio unit (RU) of a mobile phone. The other configurations of the PA and the RU of the base station or the mobile phone may be well known to those skilled in the art, and thus the detailed description thereof is omitted here.

FIGS. 6A-6B are schematic structural views showing a harmonic control circuit according to an embodiment of the disclosure. FIG. 6A is a plan view and FIG. 6B is a sectional view taken along the line A-A' in FIG. 6A.

As shown in FIGS. 6A-6B, the radio frequency power amplifier 5 includes a planar dielectric substrate 60, a first conductive layer 61 disposed on a first side of the planar dielectric substrate 60, and a second conducting layer 62 disposed on a second side of the planar dielectric substrate 60. The first conductive layer 61 has a pattern comprising one or more harmonic control circuits 51. The second conductive layer 62 acts as a ground plane. The second side of the planar dielectric substrate 60 is opposite to the first side of the planar dielectric substrate 60. Further, the planar dielectric substrate 60 may be part of: a printed circuit board (PCB) or a semiconductor chip.

In the first conductive layer 61, the harmonic control circuits 51 includes a transmission line 601 of microstrip type; and a first capacitor structure 6021 and a second capacitor structure 6022. The first capacitor structure 6021 and a second capacitor structure 6022 are coupled in parallel with the transmission line 601 and disposed in symmetry about the transmission line 601. A width of an end of the transmission line 601 is larger than a width of a main body of the transmission line 601, to form a step impedance transformer.

The first capacitor structure 6021 and the second capacitor structure 6022 may include any type of capacitor structure, such as a capacitor formed by two corresponding microstrip lines with predetermined shapes. In an embodiment of the disclosure, as shown in FIG. 6A, the first capacitor structure 6021 and the second capacitor structure 6022 include a microstrip interdigital capacitor, for increasing a harmonic suppression level at a specific harmonic frequency band.

Figure 7:
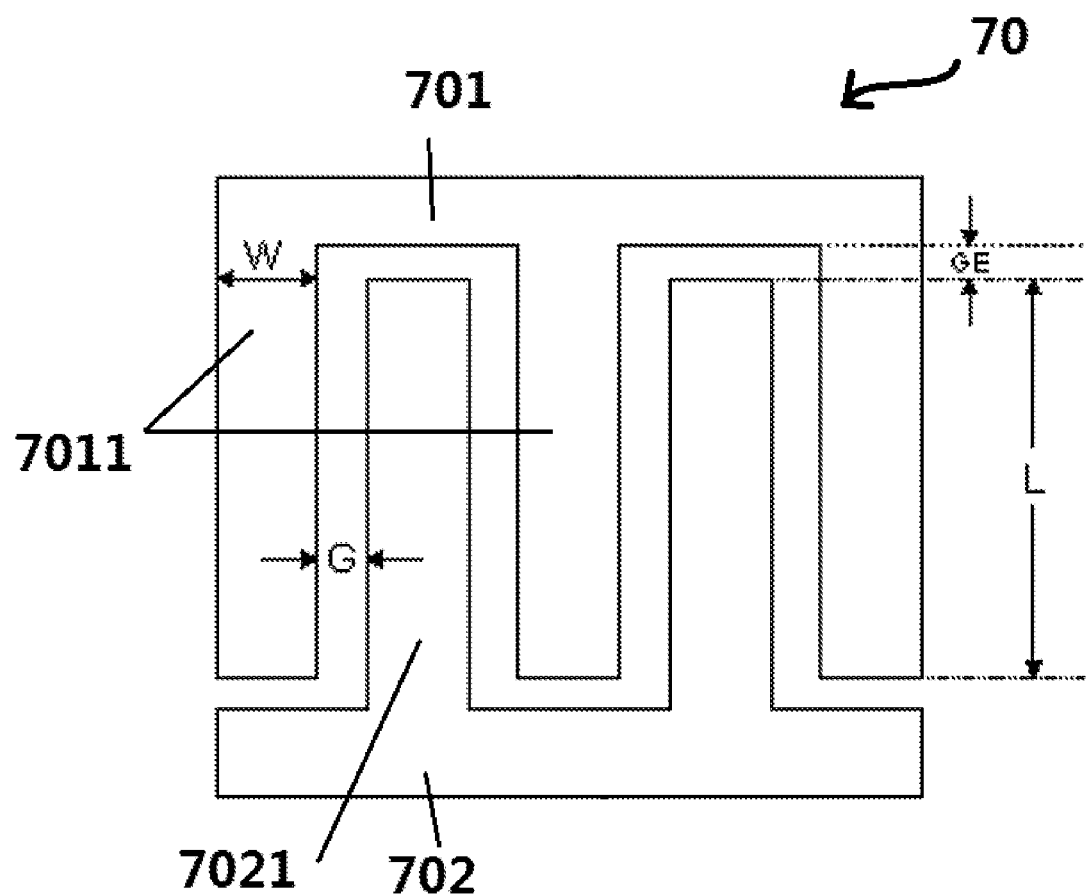
FIG. 7 is structural view showing a microstrip interdigital capacitor according to an embodiment of the disclosure.

FIG. 7 is structural view showing a microstrip interdigital capacitor according to an embodiment of the disclosure. As shown in FIG. 7, the microstrip interdigital capacitor 70 includes at least one U-shaped microstrip 701 coupled in parallel; and at least one T-shaped microstrip 702 coupled in parallel. A U-shaped microstrip 701 includes two fingers 7011 extending in parallel. A T-shaped microstrip 702 includes a finger 7021. The finger 7021 of the T-shaped microstrip 702 is disposed in a space between the two fingers 7011 of the U-shaped microstrip and extending in parallel to the two fingers 7011 of the U-shaped microstrip 701. Further, two adjacent U-shaped microstrip 701s may share a finger to save the space. Five geometry parameters are used to define a specific structure, which may be used for simulation in electronic design automation (EDA) system. These parameters include L, W, G, GE, N, wherein "L" denotes length of fingers, "W" denotes width of each finger, "G" denotes space between adjacent fingers, "GE" denotes space from a finger of one microstrip to other microstrip, and "N"

denotes number of fingers. As an example, "GE" may be equal to "G". These five parameters may determine the capacitance value, and other electrical characteristics, such as the 2nd harmonic component center frequency and bandwidth to be suppressed together with the other parts.

As an example, the two fingers 7011 of the U-shaped microstrip 701 and the finger 7021 of the T-shaped microstrip 702 have a width lager than the width of the main body of the transmission line 601.

The step impedance transformer formed in the transmission line 601 is used for fundamental matching. In other words, the transmission line 601 guarantees the fundamental matching with the step impedance transformer in signal path, while the harmonic tuning (such as second harmonic suppression) is provided by the microstrip interdigital capacitor most. Therefore, the fundamental matching and harmonic tuning can be designed completely independently. Five geometry parameters L, W, G, GE, and N may be designed independently with the transmission line 601 with the step impedance transformer. Generally, the more the U-shaped microstrip and the T-shaped microstrip are arranged in one HCC 51, the better the rejection at the second harmonic and the matching at fundamental frequency band.

Further, the HCC 51 itself is independent, thus, more than one HCC 51 may be connected in series or in parallel to enhance bandwidth and harmonic suppression effect. Generally, more HCCs 51 cascading together will bright about wider harmonic suppression bandwidth and deeper suppression level, which is trading off the HCC compactness.

Figure 8:
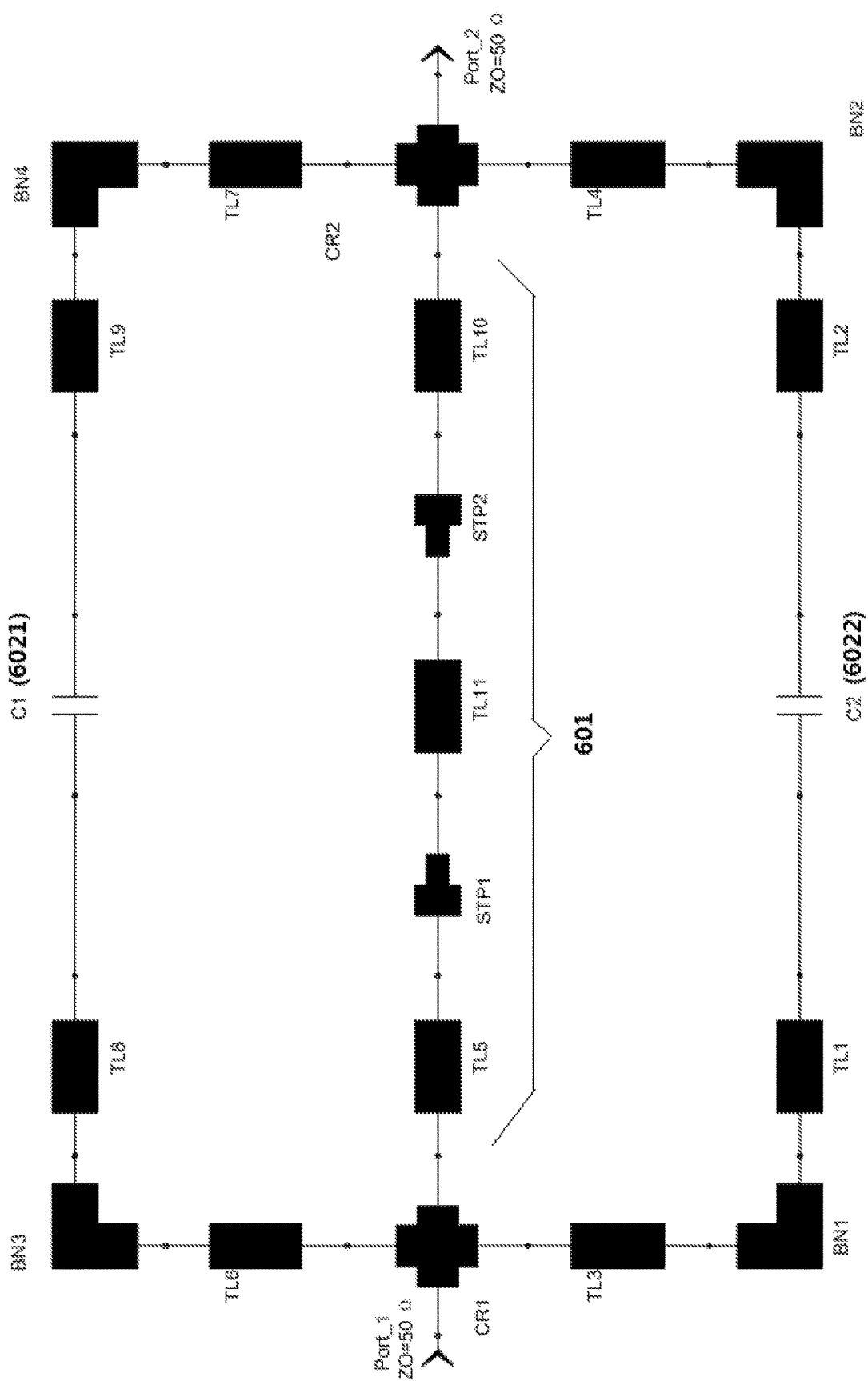
FIG. 8 is a microstrip line schematic of the harmonic control circuit according to an embodiment of the disclosure.

FIG. 8 is a microstrip line schematic of the harmonic control circuit according to an embodiment of the disclosure.

In an embodiment of the disclosure, the transmission line 601, the first capacitor structure 6021 and the second capacitor structure 6022 are coupled with each other by a cross junction (CR1, CR2). The first capacitor structure 6021 and the second capacitor structure 6022 are coupled to the cross junction (CR1, CR2) through one of: a square corner (BN1~BN4), and an optimal miter corner.

As shown in FIG. 8, there are six elements for the overall structure, electrical transmission line component (TL1~TL10), microstrip interdigital capacitor (C1, C2), bend node (BN1~BN4), microstrip cross junction (CR1, CR2), microstrip end, and microstrip tee.

As a specific arrangement, a port 1 is connected to the CR1 as a splitting node which divides the input RF signal into three branches. The upper branch is connected to TL8, C1, and TL9. The middle branch is connected to the transmission line 601, which equals to TLS, STP1, TL11, STP2, and TL10 in FIG. 8. STP1, and STP2 are two symmetrical step impedance transformers in the transmission line 601. The lower branch is connected to TL1, C1 and TL2.

Square bend nodes BN3 and BN4 are used in the upper branch, and square bend nodes BN1 and BN2 are used in the lower branch. Alternatively, bend nodes may have optimal miter angles, such as 45°.

Finally, all the three branches are combined by CR2 as a combination node. CR2 is connected to the second port 2 as the output terminal. 50Ω impedance matching may be utilized at port 1 and port 2 in FIG. 8.

As described above, more microstrip interdigital capacitor branches and step impedance transformer branches can be placed in parallel and interleaved, to enhance the HCC performance on bandwidth and harmonic suppression level.

Figure 9A:
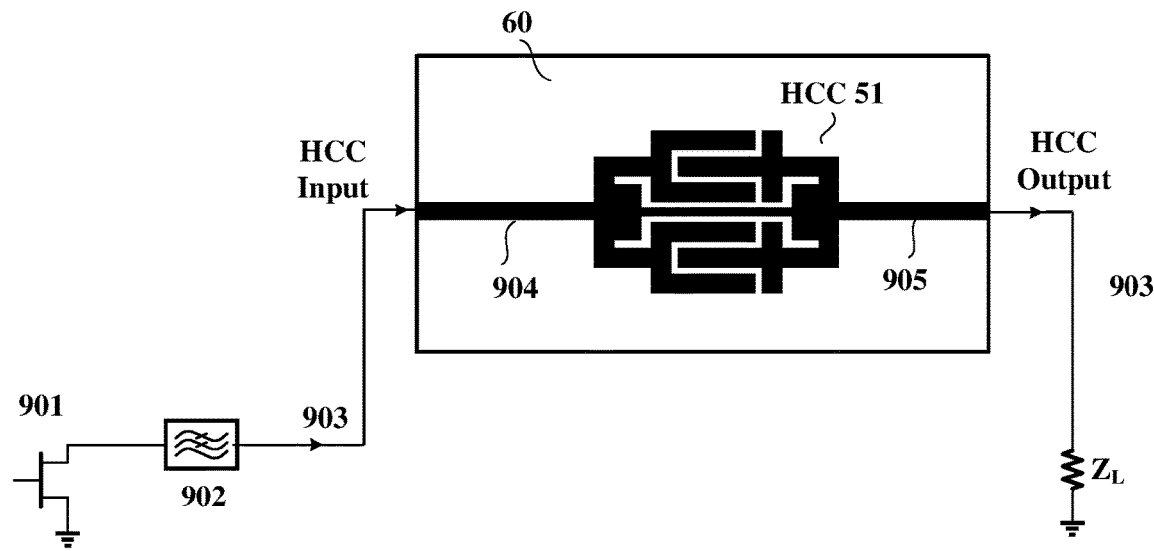
FIGS. 9A-9B show different application scenarios of a harmonic control circuit according to an embodiment of the disclosure.
Figure 9B:
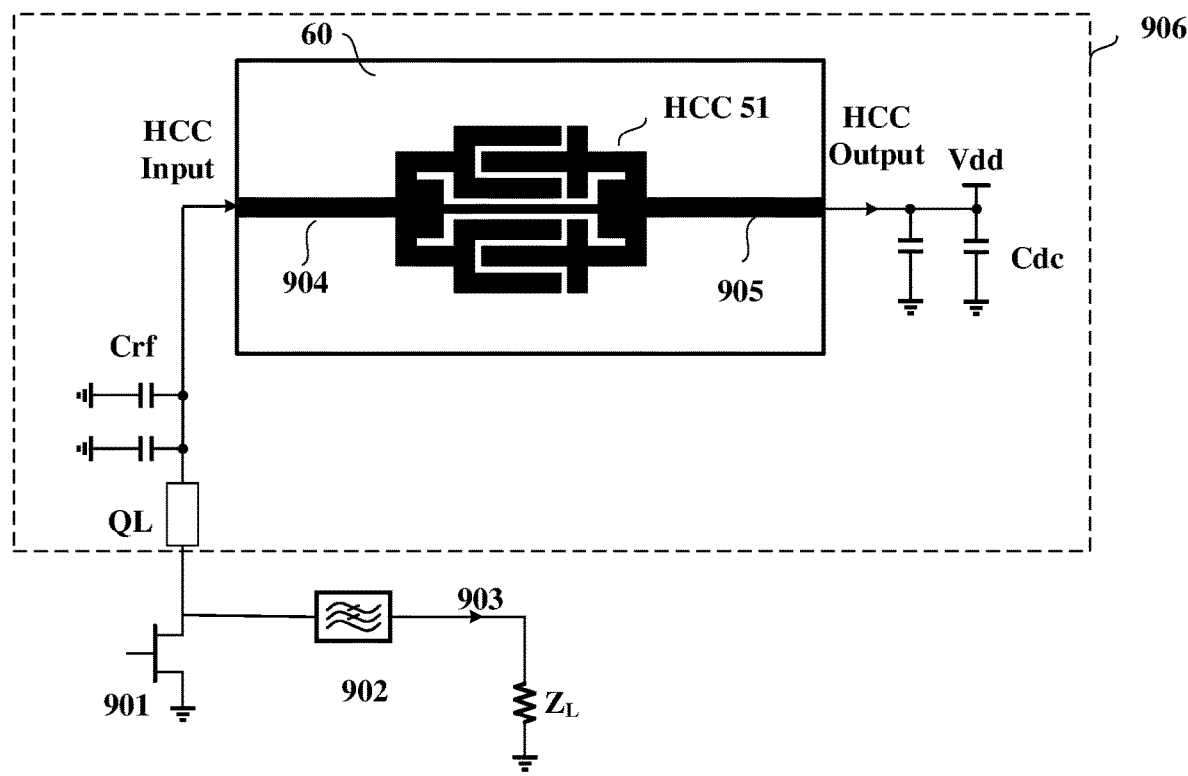

FIGS. 9A-9B show different application scenarios of a harmonic control circuit according to an embodiment of the disclosure.

The radio frequency power amplifier 5 further includes: an active device 901 (such as a transistor) including one or more input terminals and one or more output terminals; an input matching network (not shown in FIGs) arranged between the active device 901 and an input node; an input bias network (not shown in FIGs) arranged at the input terminal; an output matching network 902 arranged between the active device 901 and an output node; and an output bias network 906 arranged at the output terminal.

As shown in FIG. 9A, a harmonic control circuit 51 is cascaded with the output matching network 902. The harmonic control circuit 51 is inserted into a single path 903 between the output matching network 902 and the final load $Z_L$. The transmission line 601 in the harmonic control circuit 51 may transmit RF output signal to the final load $Z_L$.

The harmonic control circuit may further include an input impendence line 904 of microstrip type and an output impendence line 905 of microstrip type. The input impendence line 904 is coupled to the transmission line 601 in series, at an input side of the harmonic control circuit 51. The output impendence line 905 of microstrip type is coupled to the transmission line 601 in series, at an output side of the harmonic control circuit 51. The input impendence line 904 and the output impendence line 905 may have an impendence value of 50Ω, such that the design of the harmonic control circuit 51 may be independent from the output matching network 902 and the final load $Z_L$. Alternatively, if the harmonic control circuit 51, the output matching network 902 and the final load $Z_L$ are simultaneously designed, the impendence values of the input impendence line 904 and the output impendence line 905 may be adjusted, to compensate the output matching network 902 and the final load $Z_L$. The input impendence line 904 and the output impendence line 905 improve the flexibility of the design of the harmonic control circuit 51.

As shown in FIG. 9B, alternatively or additionally with the harmonic control circuit 51 as shown in FIG. 9A, a harmonic control circuit 51 is cascaded in the output biasing network 906, to transmit DC power from the DC source $V_{dd}$ to the drain of the power transistor in the active device 901. The output biasing network 906 may include a quarter wave line QL, RF signal bypass capacitors $C_{rf}$, and DC bypass capacitors $C_{dc}$. This is, the harmonic control circuit 51 is not limited to be in the single path 903.

Figure 10A:
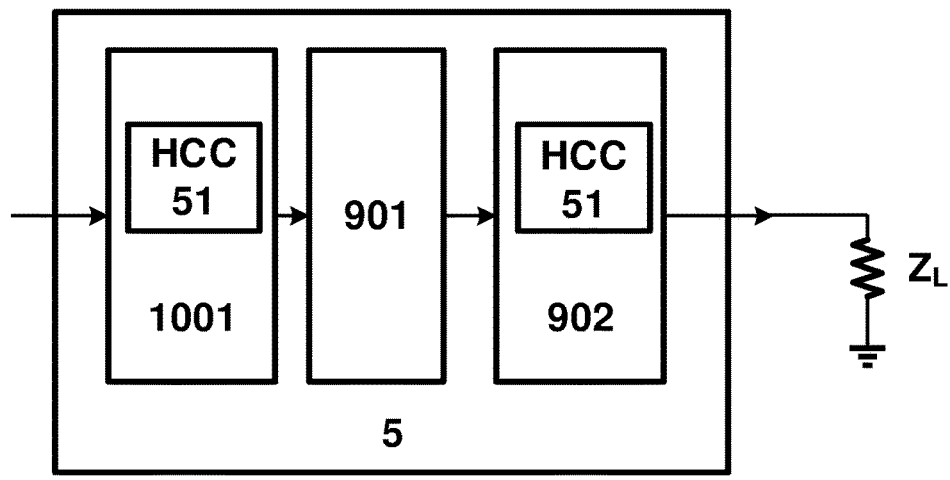
FIGS. 10A-10B show other block diagrams showing different application scenarios of a harmonic control circuit according to an embodiment of the disclosure.
Figure 10B:
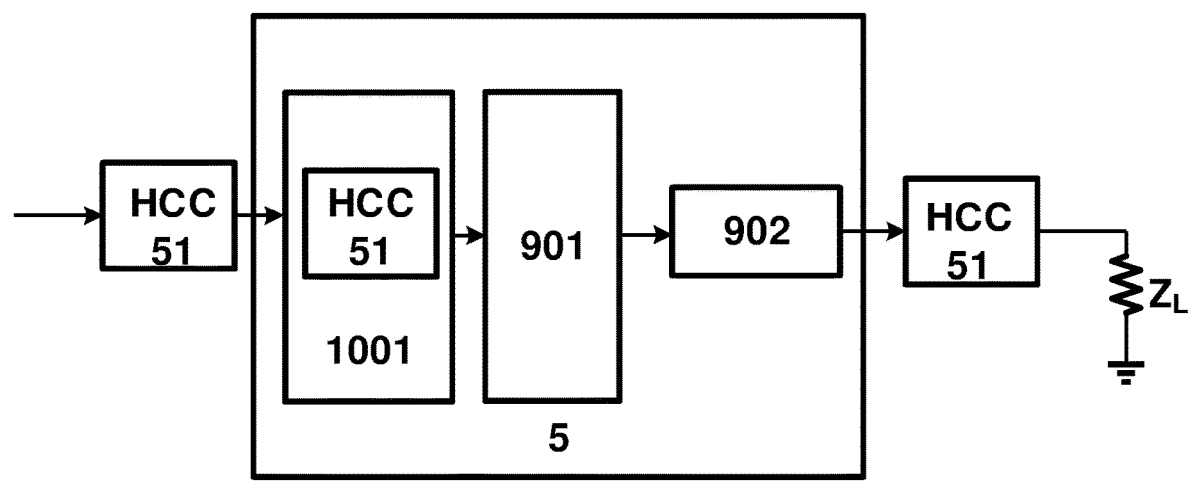

FIGS. 10A-10B show other block diagrams showing different application scenarios of a harmonic control circuit according to an embodiment of the disclosure.

The radio frequency power amplifier 5 is here shown with a single input terminal. It should be noted that the radio frequency power amplifier 5 may also include additional input terminals (such as Doherty, envelope tracking, dynamic load modulation etc.).

Generally, the one or more harmonic control circuits may be inserted into at least one of: a point in the input matching network 1001; a point in the input bias network (not shown in FIGs); a point in the output matching network 902; a point in the output bias network (not shown in FIGs); a point out of the input matching network 1001 and the output matching network 902; and a point out of the input matching network 1001 and the output matching network 902, while being coupled to the input matching network 1001 and/or the output matching network 902.

As shown in FIG. 10A, harmonic control circuits 51 are inserted in the input matching network 1001 and the output matching network 902. The HCCs 51 connected to radio frequency power amplifier 5, are configured to receive either the input signal inputted to or output signal generated by the active device, and further configured to control at least two harmonics of a frequency band of operation of the radio frequency power amplifier 5, by providing two short-circuit terminations on at adjacent two tuned frequencies.

As shown in FIG. 10B, harmonic control circuits 51 are further inserted at points out of the input matching network 1001 and the output matching network 902, while being coupled to the input matching network 1001 and the output matching network 902. Thus, some of the HCCs 51 are independent of the matching networks, as illustrated in FIG. 10B. This feature brings about flexibility for various application scenarios.

These harmonic control circuits 51 are configured independent of both a fundamental frequency matching and a bias network of the radio frequency power amplifier. One harmonic control circuit 51 may be configured to act as a short-circuit termination or an open-circuit termination on at least one desired harmonic frequency. More harmonic control circuits 51 are configured to act as a short-circuit termination or an open-circuit termination over a broadband of harmonic frequencies with deep harmonic suppression levels.

Figure 11:
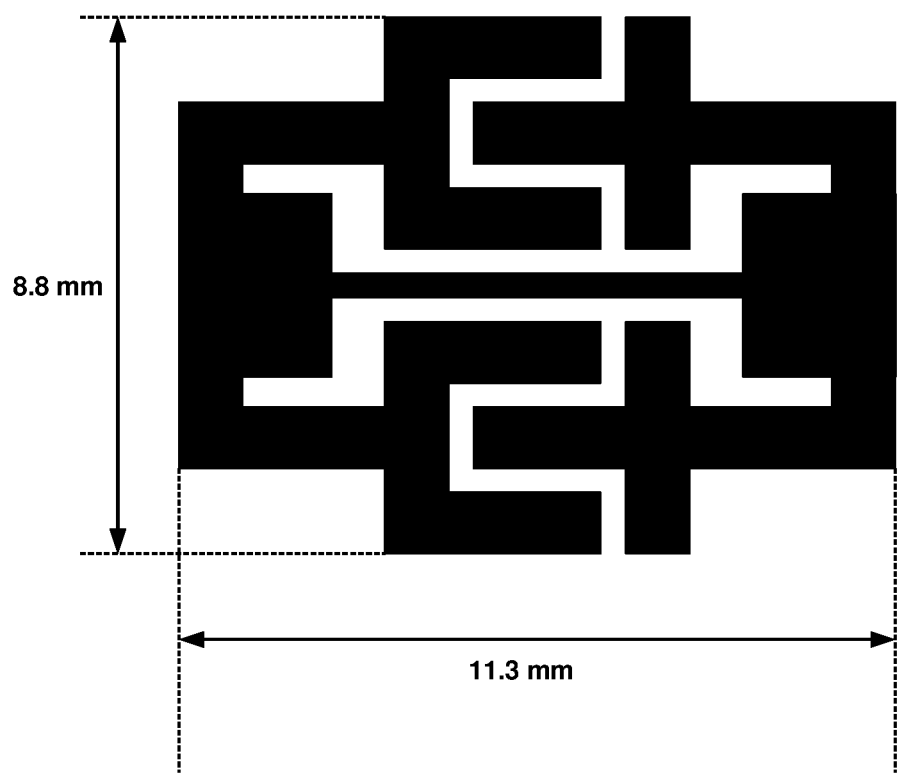
FIG. 11 shows a size of a harmonic control circuit implemented for a fundamental frequency in 1800 MHz to 1900 Mhz band according to an embodiment of the disclosure.

FIG. 11 shows a size of a harmonic control circuit implemented for a fundamental frequency in 1800 MHz to 1900 MHz band according to an embodiment of the disclosure. As shown in FIG. 11, the harmonic control circuit only occupy a space of 11.3 mm*8.8 mm, thus, a compact size was realized.

Figure 12:
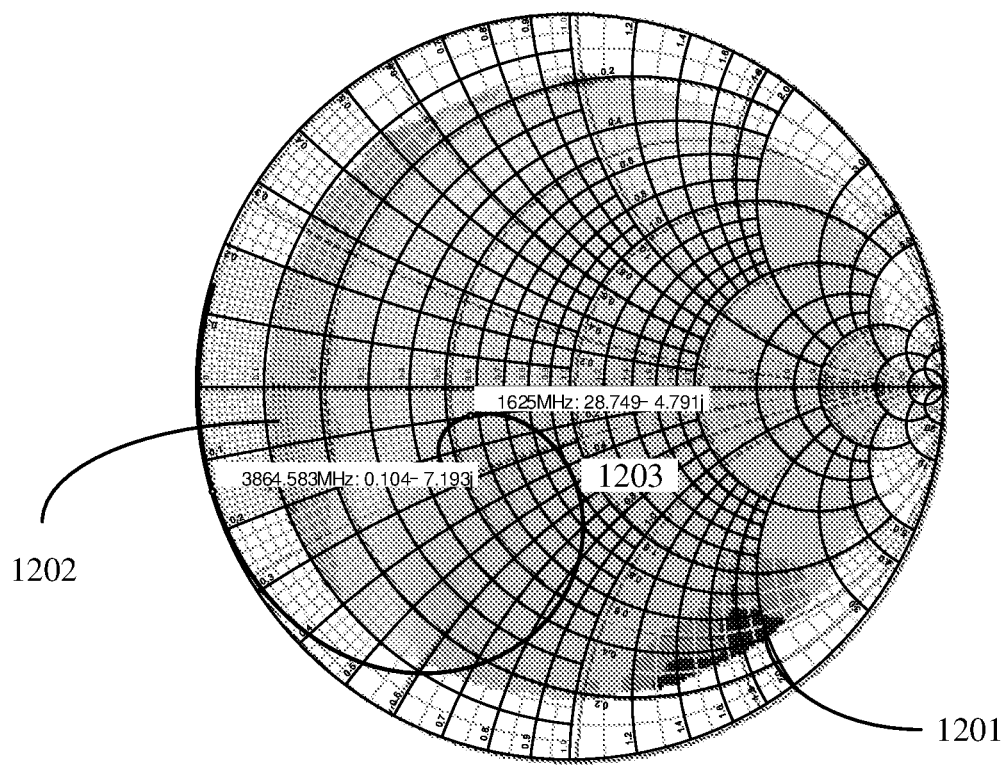
FIG. 12 shows a Smith chart with $2^{nd}$ harmonic load pull data of exemplary GaN HEMT transistor.

FIG. 12 shows a Smith chart with $2^{nd}$ harmonic load pull data of exemplary GaN HEMT transistor. Advanced design system (ADS) are used to perform electromagnetic simulation (EM simulation) to design the 2nd harmonic termination for GaN HEMT device (i.e. the radio frequency power amplifier) with the 2nd harmonic load pull data as illustrated in FIG. 12. The fundamental component is set as 1860 MHz for example.

In FIG. 12, a region with relatively low output efficiency 1201 and a region with relatively high output efficiency 1202 are shown. To maximize the efficiency performance by harmonic manipulation, it found the short-circuit impedance range at lower-left corner of Smith chart is highly desired.

ADS momentum simulation is performed on the HCC 51 with a substrate definition including a PCB material of "RO4350 20 mil ½ oz. copper". An impendence characteristics curve 1203 of the harmonic control circuits 51 is shown in the Smith chart after the simulation. The impendence characteristics curve 1203 substantively falls into a region with relatively high output efficiency, especially around 2nd harmonic frequency, such as 3864.58 MHz. In this impendence characteristics curve 1203, a point near fundamental component (1625 MHz: 28.749-4.791j) and a point near 2nd harmonic frequency (3864.583 MHz: 0.104-7.193j) are shown.

Figure 13A:
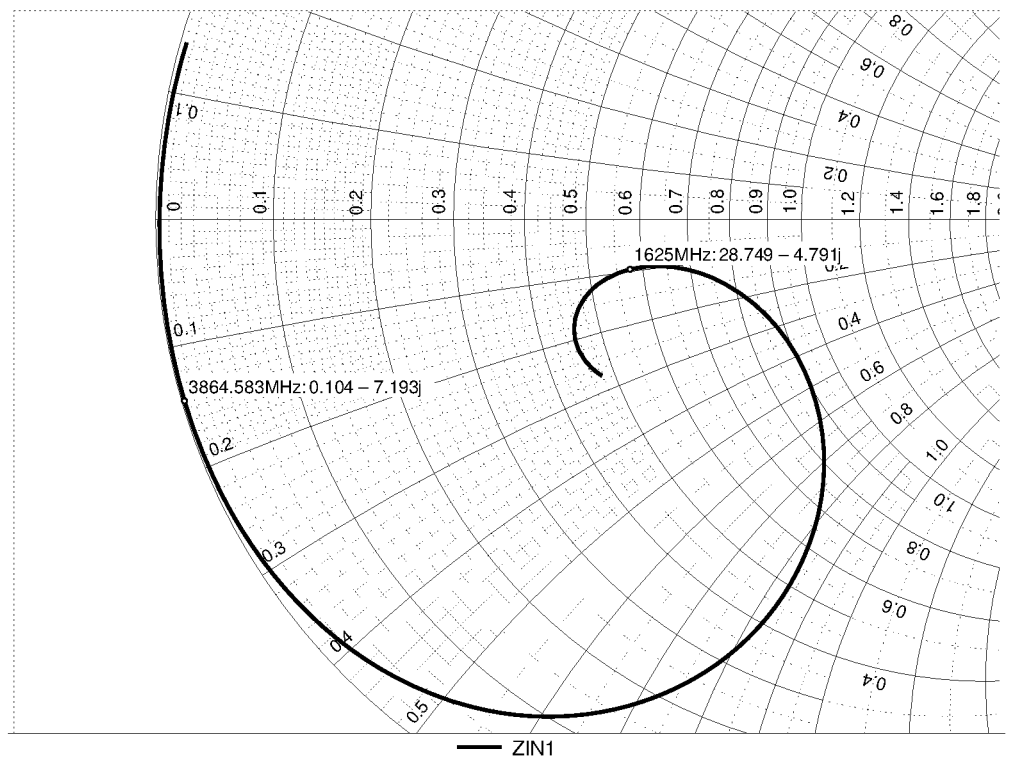
FIGS. 13A-13B shows the impendence characteristics of the harmonic control circuits according to an embodiment of the disclosure.
Figure 13B:
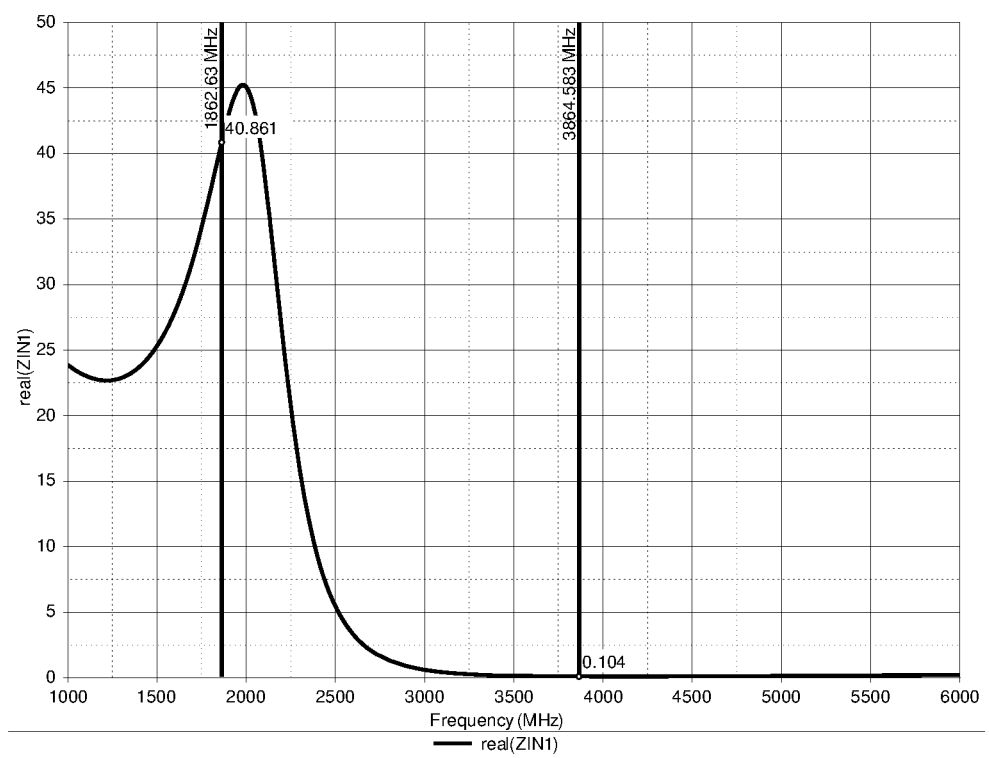

FIGS. 13A-13B shows the impendence characteristics of the harmonic control circuit 51. FIG. 13A shows the impendence characteristics curve 1203 of the harmonic control circuit 51. FIG. 13B shows the curve of the real part of the input impedance of the harmonic control circuit 51.

The resulting EM simulated input impedance trace of this situation is presented in polar form in FIG. 13A. To illustrate the behavior of the HCC of present disclosure, frequency range 1.8~1.9 GHz range represents fundamental frequency, and the 3.86 GHz range represents 2nd harmonic frequency. Therefore, the 2nd harmonic trace are placed at the lower-left of the chart representing a short-circuit termination for the design target and the centered the 1.86 GHz representing a ~50 Ohm termination.

As can be seen in FIG. 13B, an acceptable matching impedance is presented at f0 with real part of the impedance around 40 Ohm, and an acceptable short-circuit termination is presented at $2*f_0$ with real part of the impedance around 0.08 Ohm.

In the present disclosure, one HCC unit realizes both a second harmonic short-circuit termination and fundamental frequency matching simultaneously. Further, a good match curve around 50 Ohm at fundamental frequency to the characteristic impedance of the bias line may be predefined.

Figure 14A:
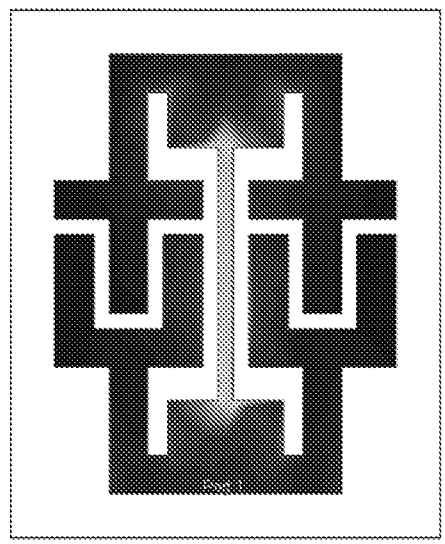
FIGS. 14A-14B shows a simulation result about the current distribution of the harmonic control circuits according to an embodiment of the disclosure.
Figure 14B:
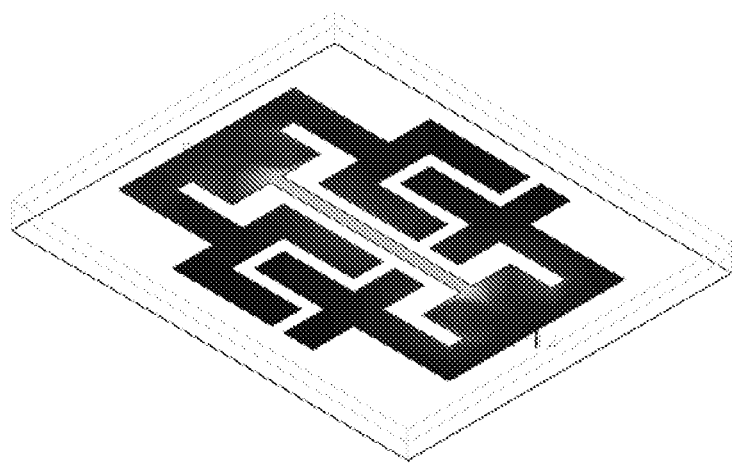

FIGS. 14A-14B shows a simulation result about the current distribution the harmonic control circuits 51 according to an embodiment of the disclosure. FIG. 14A is a top view, and FIG. 14B is an isometric view. As shown in the FIGS. 14A-14B, in the transmission line 601, the intensity of current is relatively big, to perform the function of transmitting signal. The intensities of current in the first capacitor structure 6021 and the second capacitor structure 6022 are relatively low, to manipulate the harmonic component.

Figure 15:
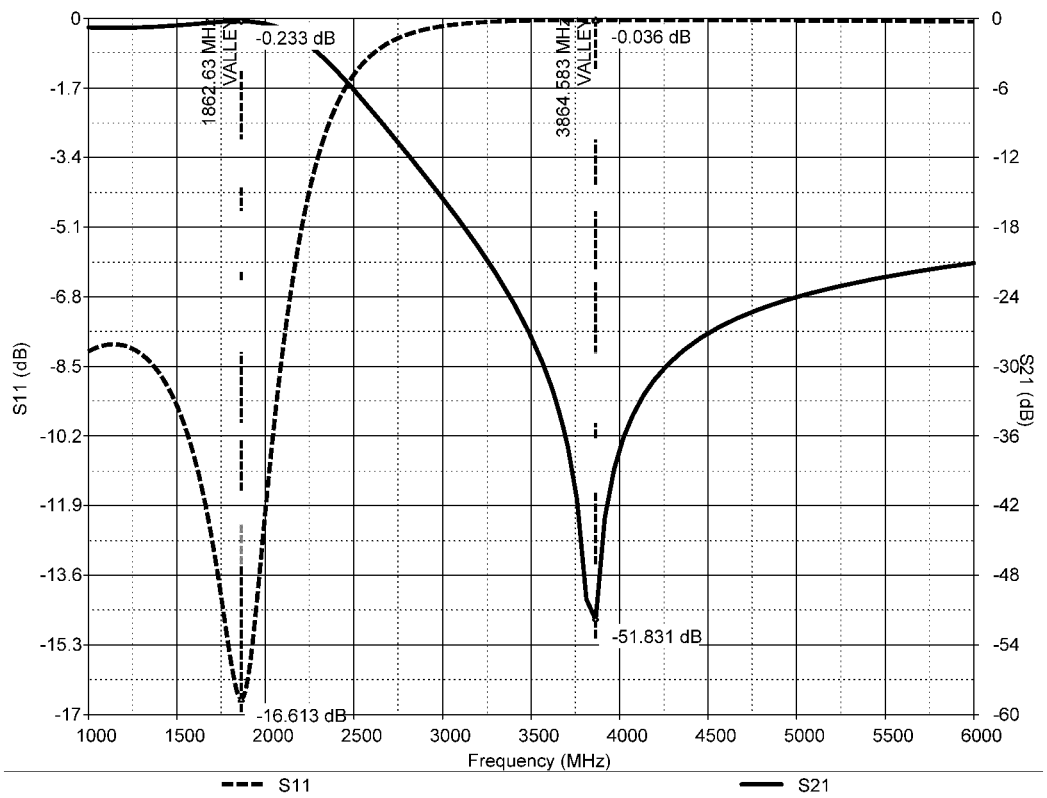
FIG. 15 shows a dB-plot of the electromagnetic (EM) simulated reflection and transmission of the harmonic control circuits according to an embodiment of the disclosure.

FIG. 15 shows a dB-plot of the EM simulated reflection and transmission of the harmonic control circuits 51. The FIG. 15 is plotted under 50 Ohm impedance arrangement for the harmonic control circuits 51.

In FIG. 15, a dashed line S11 shows reflection characteristic and a solid line S21 shows transmission characteristic. The EM simulated reflection (i.e. return loss (RL)) in dB-scale of HCC input port versus frequency is represented with the dashed line S11. Simulated transmission (i.e. insertion loss (IL)) in dB-scale between HCC input port and output port versus frequency is also shown, in the solid line S21. In this exemplary embodiment, the fundamental frequency $f_0$ is at 1.86 GHz band. It should be noted that any suitable value of $f_0$ can be used.

At $f_0$ the HCC is a "through" character. Therefore, the HCC presents a good match to the port impedance, as can be seen in FIG. 15, (with −16.6 dB return loss, RL) and consequently nearly lossless transmission (with around ~0 dB insertion loss, IL) under 50 Ohm system impedance plotting.

At the second harmonic, i.e. at $2*f_0$: 3.86 GHz, the HCC 51 presents a short-circuit termination to the HCC input port. Thus, the HCC presents almost total reflection (with 0 dB return loss, RL) to the HCC input port and consequently nearly perfect suppression (with around 52 dB insertion loss, IL at center region). For frequencies approximating $2*f_0$ the HCC presents a low impedance approximating a short-circuit termination, and for an arbitrary chosen suppression level (e.g. 10 dB), there exists a corresponding frequency range over which at least this suppression is maintained. A normalized suppression bandwidth can be defined as the ratio between the center frequency where maximum suppression is obtained (such as 3864.583 MHz) and the frequency range at which a suppression level bigger than 10 dB are obtained. For suppression level of 10 dB about the example in FIG. 15, a normalized suppression bandwidth greater than 60% may be achieved. However, with the same standard, the normalized suppression bandwidth in traditional quarter wave line short by capacitor in prior arts is about 7.5%. Therefore, the suppression bandwidth for $2^{nd}$ harmonic is much wider.

Figure 16:
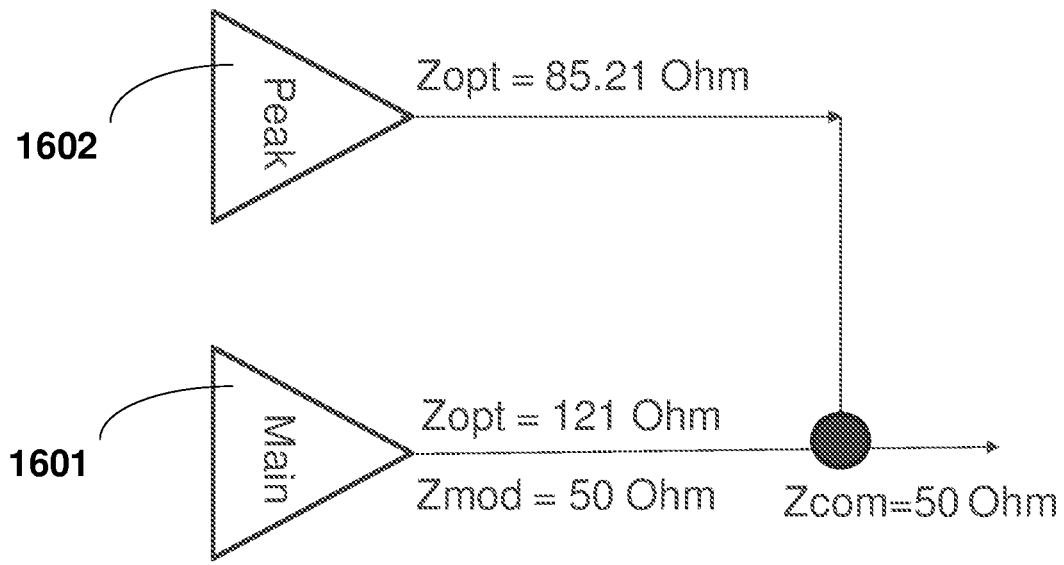
FIG. 16 shows an exemplary Doherty PA design.

FIG. 16 shows an exemplary Doherty PA design. The Doherty PA operates at 1.86 GHz center frequency with 2*160 Watt GaN HEMT device for 40 W average output power. The Doherty PA includes a main amplifier and a peak amplifier with outputs connected in parallel. As shown in FIG. 16, an optimal load impedance ($Z_{opt}$) for the peak amplifier is set to 85.21 Ohm (Ω), an optimal load impedance ($Z_{opt}$) for the main amplifier is set to 121 Ohm (Ω), an impedance modulus ($Z_{mod}$) for the main amplifier is set to 50 Ohm (Ω), and a common mode impedance ($Z_{com}$) for the Doherty PA is set to 50 Ohm (Ω).

Figure 17A:
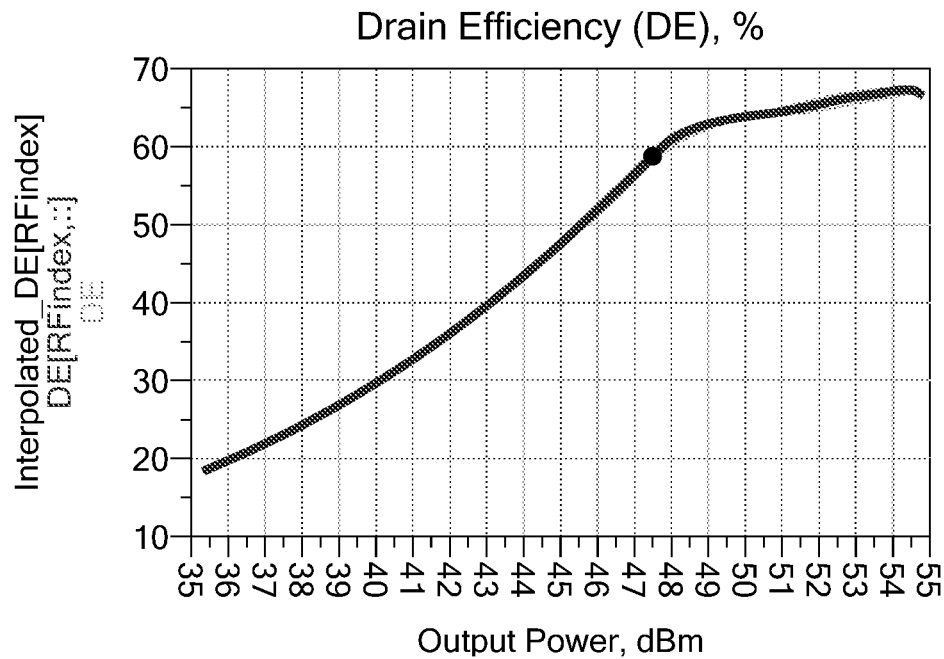
FIGS. 17A-17B show two versions of the Doherty PAs, which are mounted with HCC in the present disclosure or without HCC.
Figure 17B:
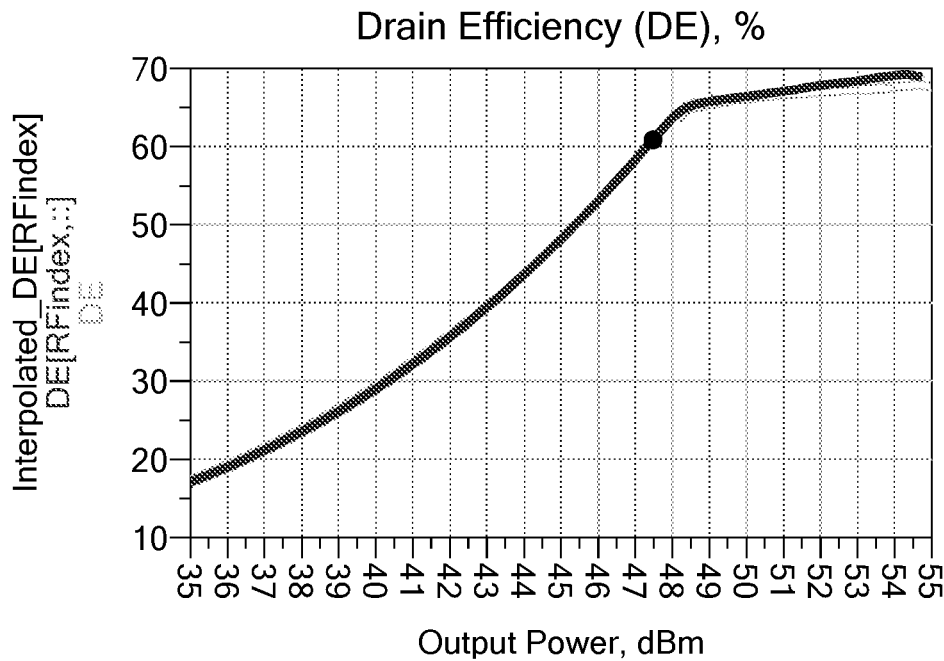

FIGS. 17A-17B show two versions of the Doherty PAs, which are mounted with HCC in the present disclosure or without HCC. FIG. 17A corresponds to the Doherty PA without HCC, and FIG. 17B corresponds to the Doherty PA with HCC. In general, the Doherty PA with HCC has higher drain efficiency in most part of the curve.

Two tables illustrate a quantitative comparison. Table 1 shows simulation results of the Doherty PA without HCC at 47.500 dBm output power. Table 2 shows simulation results of the Doherty PA with HCC at 47.500 dBm output power. Taking 1.810 GHz for example, a drain efficiency is 59.57% in the Doherty PA without HCC. A drain efficiency is 60.43% in the Doherty PA with HCC, bigger than that in the Doherty PA without HCC. Further, this happens in every frequency point, thus, an overall efficiency is obviously improved with the HCC of the present disclosure.

coupling structure. It may be compatible with a wide range of substrate-based technologies. The HCC may provide a robust short-circuit termination in compact physical size. The HCC may exhibit better harmonic suppression than traditional quarter wave line short-termination from both bandwidth and harmonic suppression level perspective. The present disclosure may provide serval-fold of the suppression bandwidth. The HCC can be either part of matching network or being independent of the matching network.

Figure 18:
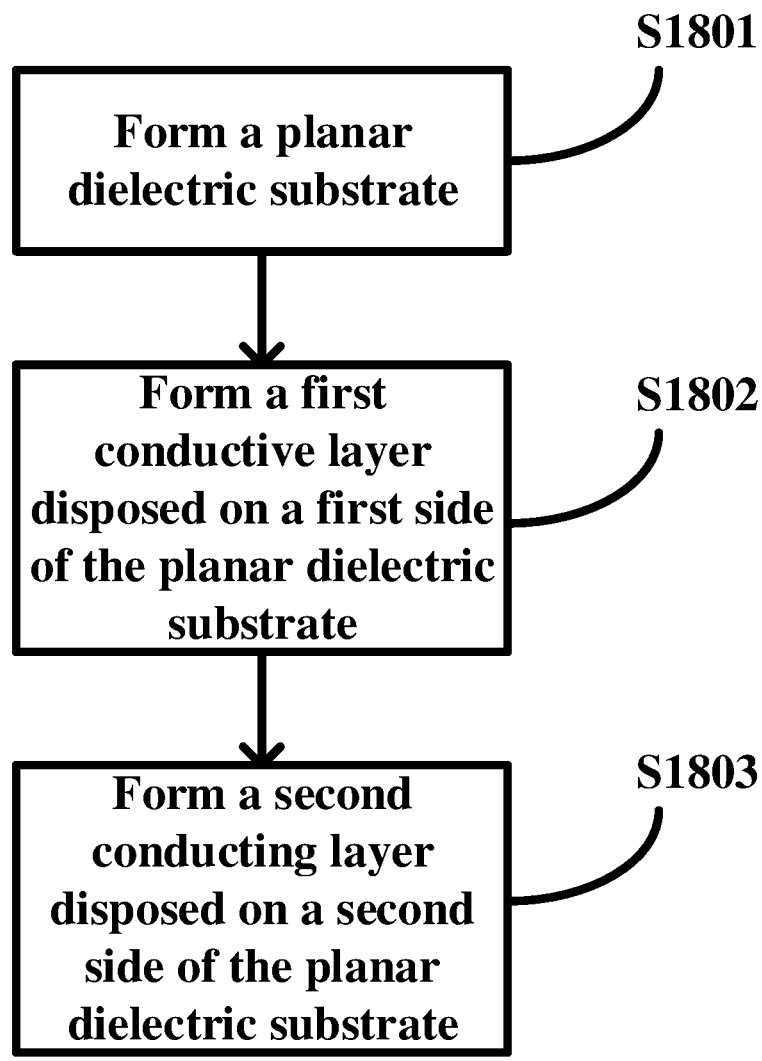
FIG. 18 shows a flow chart of a method for manufacturing a radio frequency power amplifier according to an embodiment of the disclosure.

FIG. 18 shows a flow chart of a method for manufacturing a radio frequency power amplifier according to an embodiment of the disclosure.

The method for manufacturing a radio frequency power amplifier includes step S1801, forming a planar dielectric substrate; step S1802, forming a first conductive layer disposed on a first side of the planar dielectric substrate, and step S1803, forming a second conducting layer disposed on a second side of the planar dielectric substrate.

As described above, the first conductive layer has a pattern comprising one or more harmonic control circuits. The second conductive layer acts as a ground plane. The second side of the planar dielectric substrate is opposite to the first side of the planar dielectric substrate.

TABLE 1 simulation results of the Doherty PA without HCC
Interpolated Values at 47.500 dBm output power (approximately):

| | Fundamental Output Power dBm | Transducer Power Gain | Gain Compression | Drain Efficiency (DE), % | DC Power Consumpt. Watts | Thermal Dissipation Watts |
|---|---|---|---|---|---|---|
| 1.810 G | 47.48 | 14.33 | 1.424 | 59.57 | 92.28 | 38.09 |
| 1.820 G | 47.49 | 14.34 | 1.397 | 59.33 | 92.83 | 38.54 |
| 1.830 G | 47.49 | 14.34 | 1.384 | 59.07 | 93.32 | 38.97 |
| 1.840 G | 47.49 | 14.34 | 1.380 | 58.76 | 93.79 | 39.46 |
| 1.850 G | 47.49 | 14.34 | 1.379 | 58.47 | 94.38 | 39.97 |
| 1.860 G | 47.50 | 14.35 | 1.388 | 58.25 | 94.92 | 40.40 |
| 1.870 G | 47.50 | 14.35 | 1.413 | 58.01 | 95.42 | 40.83 |
| 1.880 G | 47.50 | 14.35 | 1.449 | 57.72 | 96.03 | 41.35 |

TABLE 2 simulation results of the Doherty PA with HCC
Interpolated Values at 47.500 dBm output power (approximately):

| | Fundamental Output Power dBm | Transducer Power Gain | Gain Compression | Drain Efficiency (DE), % | DC Power Consumpt. Watts | Thermal Dissipation Watts |
|---|---|---|---|---|---|---|
| 1.810 G | 47.46 | 14.46 | 1.046 | 60.43 | 90.53 | 36.55 |
| 1.820 G | 47.51 | 14.71 | 757.3 m | 60.64 | 89.24 | 36.39 |
| 1.830 G | 47.51 | 14.41 | 1.005 | 60.91 | 89.92 | 36.08 |
| 1.840 G | 47.48 | 14.18 | 1.191 | 60.85 | 90.15 | 36.02 |
| 1.850 G | 47.49 | 14.04 | 1.294 | 60.94 | 90.30 | 36.00 |
| 1.860 G | 47.50 | 13.90 | 1.405 | 60.90 | 90.41 | 36.10 |
| 1.870 G | 47.50 | 13.75 | 1.528 | 60.82 | 90.44 | 36.20 |
| 1.880 G | 47.49 | 13.59 | 1.667 | 60.74 | 90.47 | 36.30 |

With the above described embodiments, the HCC may provide ultra-wide band $2^{nd}$ harmonic suppression with >60% suppression level defined above. The HCC may provide high density and flexibility of integration within a high-power matching network. The branch placement makes it be easily decoupled from the matching network or further enhance performance by adding it onto proper insertion position. The HCC may be an independent part for harmonic control. It may be easy to implement the "U-T" shape Further, the harmonic control circuit includes: a transmission line of microstrip type; and a first capacitor structure and a second capacitor structure, coupled in parallel with the transmission line, and disposed in symmetry about the transmission line. A width of an end of the transmission line is larger than a width of a main body of the transmission line, to form a step impedance transformer.

In general, the various exemplary embodiments may be implemented in hardware or special purpose circuits, software, logic, or any combination thereof. For example, some aspects may be implemented in hardware, while other aspects may be implemented in computer code or software which may be executed by a controller, microprocessor, or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly computer code) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A radio frequency power amplifier, comprising:
    a planar dielectric substrate;
    a first conductive layer disposed on a first side of the planar dielectric substrate, the first conductive layer having a pattern comprising one or more harmonic control circuits; and
    a second conductive layer disposed on a second side of the planar dielectric substrate, the second conductive layer acting as a ground plane, the second side of the planar dielectric substrate being opposite the first side of the planar dielectric substrate; and
    each harmonic control circuit comprises:
        a transmission line of microstrip type, a width of an end of the transmission line being larger than a width of a main body of the transmission line as to form a step impedance transformer; and
        a first capacitor structure and a second capacitor structure, coupled in parallel with the transmission line, and disposed in symmetry about the transmission line.

2. The radio frequency power amplifier according to claim 1, wherein the first capacitor structure and the second capacitor structure comprise a microstrip interdigital capacitor, for increasing a harmonic suppression level at a specific harmonic frequency band.

3. The radio frequency power amplifier according to claim 2, wherein the interdigital capacitor comprises:
    at least one U-shaped microstrip coupled in parallel;
    at least one T-shaped microstrip coupled in parallel;
    wherein a U-shaped microstrip comprises two fingers extending in parallel; and
    wherein a T-shaped microstrip comprises a finger, disposed in a space between the two fingers of the U-shaped microstrip, and extending in parallel to the two fingers of the U-shaped microstrip.

4. The radio frequency power amplifier according to claim 3, wherein the two fingers of the U-shaped microstrip and the finger of the T-shaped microstrip have a width lager than the width of the main body of the transmission line.

5. The radio frequency power amplifier according to claim 1, wherein the harmonic control circuit further comprises:
    an input impendence line of microstrip type, coupled to the transmission line in series, at an input side of the harmonic control circuit; and an output impendence line of microstrip type, coupled to the transmission line in series, at an output side of the harmonic control circuit.

6. The radio frequency power amplifier according to claim 1, wherein the transmission line the first capacitor structure and the second capacitor structure are coupled with each other by a cross junction; and wherein the first capacitor structure and the second capacitor structure are coupled to the cross junction through one of: a square corner, and an optimal miter corner.

7. The radio frequency power amplifier according to claim 1, wherein the one or more harmonic control circuits are configured independent of both a fundamental frequency matching and a bias network of the radio frequency power amplifier.

8. The radio frequency power amplifier according to claim 1, wherein the one or more harmonic control circuits are configured to act as a short-circuit termination or an open-circuit termination over a broadband of harmonic frequencies with deep harmonic suppression levels.

9. The radio frequency power amplifier according to claim 1, wherein the planar dielectric substrate is part of: a printed circuit board (PCB) or a semiconductor chip.

10. The radio frequency power amplifier according to claim 1, wherein the one or more harmonic control circuits comprises: a plurality of harmonic control circuits cascaded in at least one of: a matching network and a biasing network, so as to form a high order harmonic control circuit which supports a broader harmonic suppression bandwidth and a deeper harmonic suppression level.

11. The radio frequency power amplifier according to claim 1, further comprising:

an active device comprising one or more input terminals and one or more output terminals;

an input matching network arranged between the active device and an input node;

an input bias network arranged at the input terminal;

an output matching network arranged between the active device and an output node; and an output bias network arranged at the output terminal.

12. The radio frequency power amplifier according to claim 11, wherein the one or more harmonic control circuits are inserted into at least one of:

a point in the input matching network;

a point in the input bias network;

a point in the output matching network;

a point in the output bias network;

a point out of the input matching network and the output matching network; and a point out of the input matching network and the output matching network, while being coupled to at least one of the input matching network and the output matching network.

13. The radio frequency power amplifier according to claim 1, wherein the radio frequency power amplifier is a Doherty amplifier.

14. The radio frequency power amplifier according to claim 13, wherein the Doherty amplifier comprises: Gallium Nitride (GaN) high electron mobility transistor (HEMT).

15. The radio frequency power amplifier according to claim 1, wherein the harmonic control circuit is configured to act as a short-circuit termination or an open-circuit termination on at least one desired harmonic frequency.

16. A method for manufacturing a radio frequency power amplifier, the method comprising:

forming a planar dielectric substrate;

forming a first conductive layer disposed on a first side of the planar dielectric substrate, the first conductive layer having a pattern comprising one or more harmonic control circuits, each harmonic control circuit comprising:

a transmission line of microstrip type, a width of an end of the transmission line being larger than a width of a main body of the transmission line, as to form a step impedance transformer; and a first capacitor structure and a second capacitor structure, coupled in parallel with the transmission line, and disposed in symmetry about the transmission line; and forming a second conductive layer disposed on a second side of the planar dielectric substrate, the second conductive layer acting as a ground plane, the second side of the planar dielectric substrate being opposite the first side of the planar dielectric substrate.

* * * * *